United States Patent [19]
Choi

[11] Patent Number: 5,304,853
[45] Date of Patent: Apr. 19, 1994

[54] MULTIPLEXER

[75] Inventor: Young S. Choi, Kyungki, Rep. of Korea

[73] Assignee: Samsung Electronics Co., Ltd., Kyungki, Rep. of Korea

[21] Appl. No.: 871,090

[22] Filed: Apr. 20, 1992

[30] Foreign Application Priority Data

May 31, 1991 [KR] Rep. of Korea ............... 91-8053

[51] Int. Cl.[5] .................. H03K 17/56; H03K 19/086; H03K 17/60
[52] U.S. Cl. ............................ 307/241; 307/243; 307/455; 307/467; 307/254
[58] Field of Search ............... 307/241, 243, 455, 467

[56] References Cited

U.S. PATENT DOCUMENTS

| | | | |
|---|---|---|---|
| 4,835,771 | 5/1989 | Moussie | 307/243 |
| 4,963,767 | 10/1990 | Sing | 307/243 |
| 5,189,312 | 2/1993 | Shimizu et al. | 307/243 |
| 5,196,733 | 3/1993 | Shin | 307/243 |

Primary Examiner—William L. Sikes
Assistant Examiner—Trong Phan
Attorney, Agent, or Firm—Sughrue, Mion, Zinn, Macpeak & Seas

[57] ABSTRACT

A multiplexer capable of selecting and outputting only one signal from among a plurality of input signals, based on control signals. The multiplexer includes a constant current supplying section for supplying a circuit operating power and a signal input/output section for selecting and outputting only one signal from among a plurality of input signals based on control signals. The multiplexer also includes an inverter for receiving control signals and a selection signal supplying section for supplying selecting signals in accordance with the logic signals of the NOR logic section. According to the present invention, the number of input terminals is reduced, and every possible control signal combination is utilized, thereby preventing errors which normally occur when invalid control signal combinations are entered.

20 Claims, 3 Drawing Sheets

MULTIPLEXER

FIELD OF THE INVENTION

The present invention relates to a multiplexer, which reduces the number of control signals and prevents output malfunctions, which result when invalid control signal combinations are entered.

BACKGROUND OF THE INVENTION

Multiplexers are extensively used in various types of electric and electronic apparatus. Multiplexers selectively output only one signal among a plurality of input signals. One example of a conventional multiplexer is illustrated in FIG. 1, and is briefly described below.

The conventional multiplexer includes a constant current supplying section 10 having first, second and third transistors Q1, Q2 and Q3, and resistors $R_1$, $R_2$ and $R_3$, which supply the constant current. First, second and third comparators 11, 12 and 13 receive the constant current and receive three control signals Sc1, Sc2 and Sc3. The first and second control signals Sc1 and Sc2 are connected to the bases of the fourth and fifth transistors Q4 and Q5 in the first comparator 11, respectively. The third control signal Sc3 is connected to the base of a 6th transistor Q6 in the second comparator 12, and to the base of a 9th transistor Q9 in the third comparator 13. A pair of transistors in each comparator is operated such that only one transistor in each pair is turned on at any given time in accordance with the value of the control signals. That is, if the 4th transistor Q4 is turned on, the 5th transistor Q5 is turned off. Similarly, the transistors of the second and third comparators 12 and 13 operate to ensure that when one transistor of each pair is turned on, the other is turned off.

The first comparator 11 is connected in series with the second and third comparators 12 and 13. Thus, if the 4th transistor Q4 is turned on, then one of the 6th and 7th transistors Q6 and Q7 must also be turned on. Similarly, if the 5th transistor Q5 is turned on, then one of the 8th and 9th transistors Q8 and Q9 must also be turned on. The output of the constant current supplying section 10 is supplied to the bases of the 7th and 8th transistors Q7 and Q8 as a reference voltage, after being voltage-divided by the resistors R4 and R5. Therefore, the "ON/OFF" operations of the 7th and 8th transistors Q7 and Q8 are governed by the voltage level of the third control signal Sc3.

In accordance with the states of the three control signals, various combinations can be formed to allow the multiplexer to perform different operations. Consequently, different output signals can be obtained as will be described in detail below.

In the first example, the first control signal Sc1 has an H (high) state, and the second and third control signals Sc2 and Sc3 have an L (low) state. Thus, the 4th transistor Q4 is turned off, and the 5th transistor Q5 is turned on. Accordingly, current is supplied to the third comparator 13, while no current is supplied to the second comparator 12. In the third comparator 13, the 8th transistor Q8 is turned off, while the 9th transistor Q9 is turned on. Therefore, the constant current from the constant current supplying section 10 is supplied through the 5th and 9th transistors Q5 and Q9 to the bases of the 10th and 14th transistors Q10 and Q14 in a current mirror circuit 14, thereby turning on the 10th and 14th transistors Q10 and Q14.

Meanwhile, first, second, third and fourth input signals Si1, Si2, Si3 and Si4 are respectively supplied to the bases of the 20th, 21st, 22nd and 23rd transistors Q20, Q21, Q22 and Q23 in a signal input/output section 15. When the 14th transistor Q14 is turned on, the 23rd transistor Q23 is also turned on, since the emitter of transistor Q23 becomes low relative to the base. Therefore, the level of the voltage supplied to the bases of 18th and 19th transistors Q18 and Q19 is lowered.

When this voltage level drops sufficiently, the 18th and 19th transistors Q18 and Q19 are turned on, which turns on the 27th transistor Q27. Consequently, the fourth input signal Si4 is obtained in the form of an output signal So. Here, the inverted signal of the fourth input signal Si4 is supplied to the bases of the 18th and 19th transistors Q18 and Q19. A reinverted signal is obtained from the collector of the 19th transistor Q19, with the result that the final output signal So becomes the same as the fourth input signal Si4.

In the second example, the first control signal Sc1 and the third control signal Sc3 have an H state, and the second control signal has an L state. The 5th transistor Q5 of the first comparator 11 is turned on by the first and second control signals, and the 8th transistor Q8 of the third comparator 13 is turned on by the third control signal. Consequently, the current from the constant current supplying section 10 is supplied through the 5th and 8th transistors Q5 and Q8 to the bases of 11th and 15th transistors Q11 and Q15 of the current mirror circuit 14 respectively. Then the 11th and 15th transistors Q11 and Q15 are turned on. Accordingly, the 22nd and 26th transistors Q22 and Q26 of a signal input/output section 15 are turned on, thereby selecting and outputting a third input signal Si3.

In the third example, the first and third control signals Sc1 and Sc3 have an L state, and the second control signal Sc2 has an H state. Accordingly, the first input signal Si1 is output through the output terminal So.

In the fourth example, the first control signal Sc1 has an L state, and the second and third control signals Sc2 and Sc3 have an H state. Therefore, the second input signal Si2 is output through the output terminal So.

The third and fourth cases can be easily understood by referring to the drawings because they control the appropriate transistors in the manner described above for the first and second examples, and therefore, detailed descriptions are omitted.

In a final example, operation of this conventional circuit will be described, in which the first and second control signals have the same state.

First, when the first and second control signals have an H state, the 4th and 5th transistors Q4 and Q5 are both turned off. Therefore, power is not supplied to the second and third comparators 12 and 13. This control signal combination renders the conventional circuit in-operative. Consequently, a signal can not be obtained from the output terminal So.

Further, when the first and second control signals have an L state, the 4th and 5th transistors Q4 and Q5 of the first comparator 11 are both turned on. This state combination causes power to be supplied to the second and third comparators 12 and 13. Under this condition, if the third control signal Sc3 has an L state, the 6th and 9th transistors Q6 and Q9 are turned on. Thus, the 13th and 17th transistors Q13 and Q17 are turned on by the collector current of the 6th transistor Q6, and the 10th and 14th transistors Q10 and Q14 are turned on by the collector current of the 9th transistor Q9. Consequently, the 20th and 24th transistors Q20 and Q24, as well as the 23rd and 27th transistors Q23 and Q27, of the signal input/output section 15 are all turned on. This forms a combination wave, which includes the first input signal Si1 and the fourth input signal Si4, as the output signal.

Further, when the first and second control signals have an L state, and the third control signal has an H state, the 7th and 8th transistors Q7 and Q8 of the second and third comparators 12 and 13 are respectively turned on. These control states causes the 11th and 15th transistors Q11 and Q15, as well as the 12th and 16th transistors Q12 and Q16, of the current mirror circuit 14 to be turned on. Consequently, the 21st and 25th transistors Q21 and Q25, together with the 22nd and 26th transistors Q22 and Q26, of the signal input/output section 15 are all turned on. Thus, a combination wave is again formed, which includes the second input signal Si2 and the third input signal Si3, as the output.

As described above, the multiplexer performs the function of selectively outputting one input signal selected from a plurality of input signals under the control of the combined control signals described in the first to fourth examples. However, in the final example, where the first and second control signals have the same states, the multiplexer malfunctions. In order to prevent such a malfunction, the use of some combinations of the control signals are avoided.

Thus, the conventional multiplexers have a drawback in that malfunctions sometimes occurs, and a further disadvantage is that it operates in an uneconomical manner, since every control signal combination can not be used.

SUMMARY OF THE INVENTION

Therefore, it is an object of the present invention to provide a multiplexer which reduces the number of terminals needed for control signals in a multiplexer capable of outputting one signal selected from a plurality of input signals.

It is another object of the present invention to provide a multiplexer in which errors are not generated in the circuit, and which utilizes all of the possible control signal combinations.

In achieving the above objects, the multiplexer having a signal input/output section for outputting one signal selected from a plurality of input signals, comprises: a NOR logic section including a plurality of NOR gates, each of which generates binary signals in accordance with control signals; means for supplying a selecting signal to the signal input/output section in accordance with the binary signals from the NOR logic section; and means for supplying the control signals to the NOR gates so that one of the NOR gates generates a logic signal different from the rest of the NOR gates in order to output a desired input signal from a plurality of input signals.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
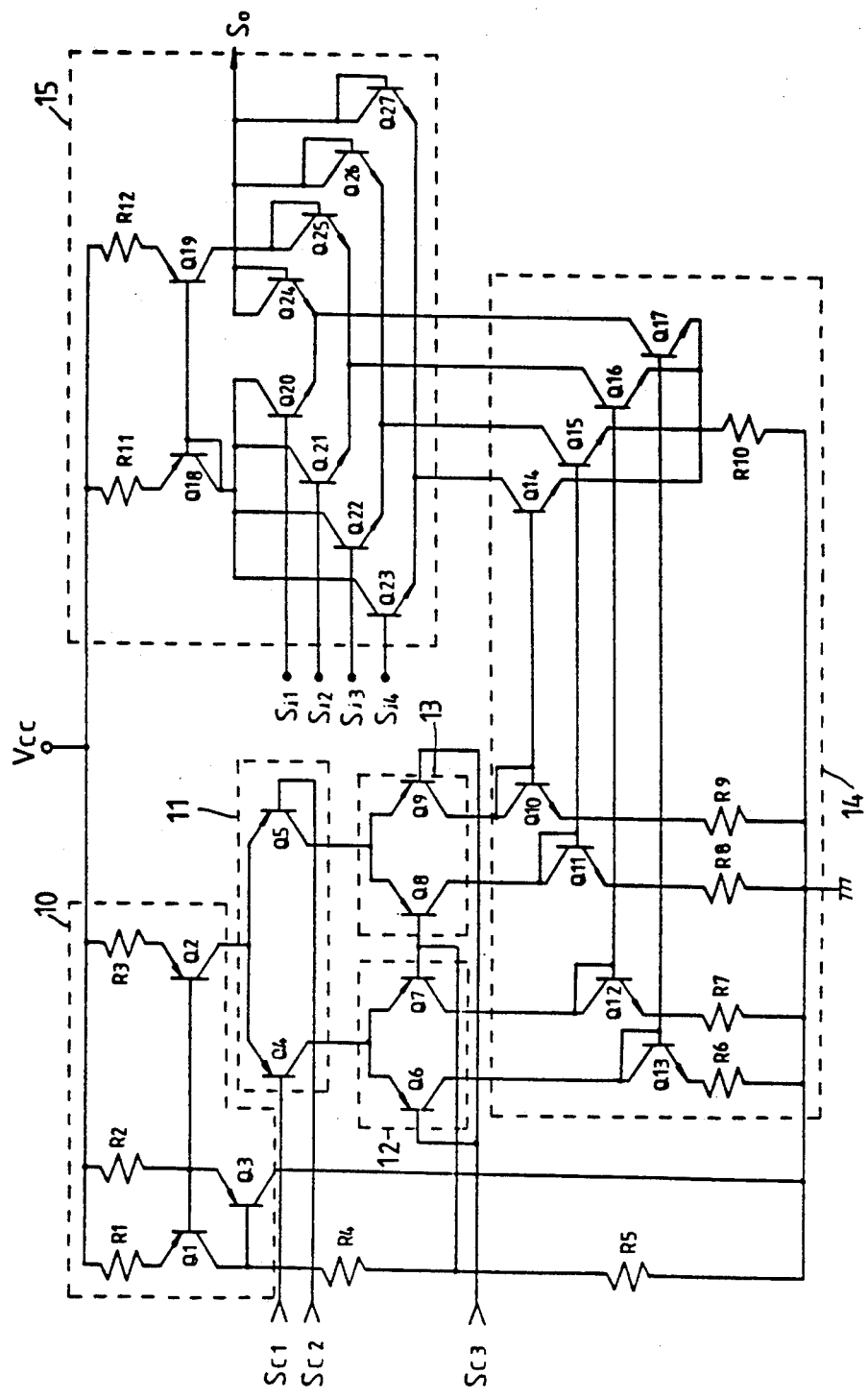
FIG. 1 is a circuit diagram illustrating one embodiment of a conventional multiplexer.
Figure 2:
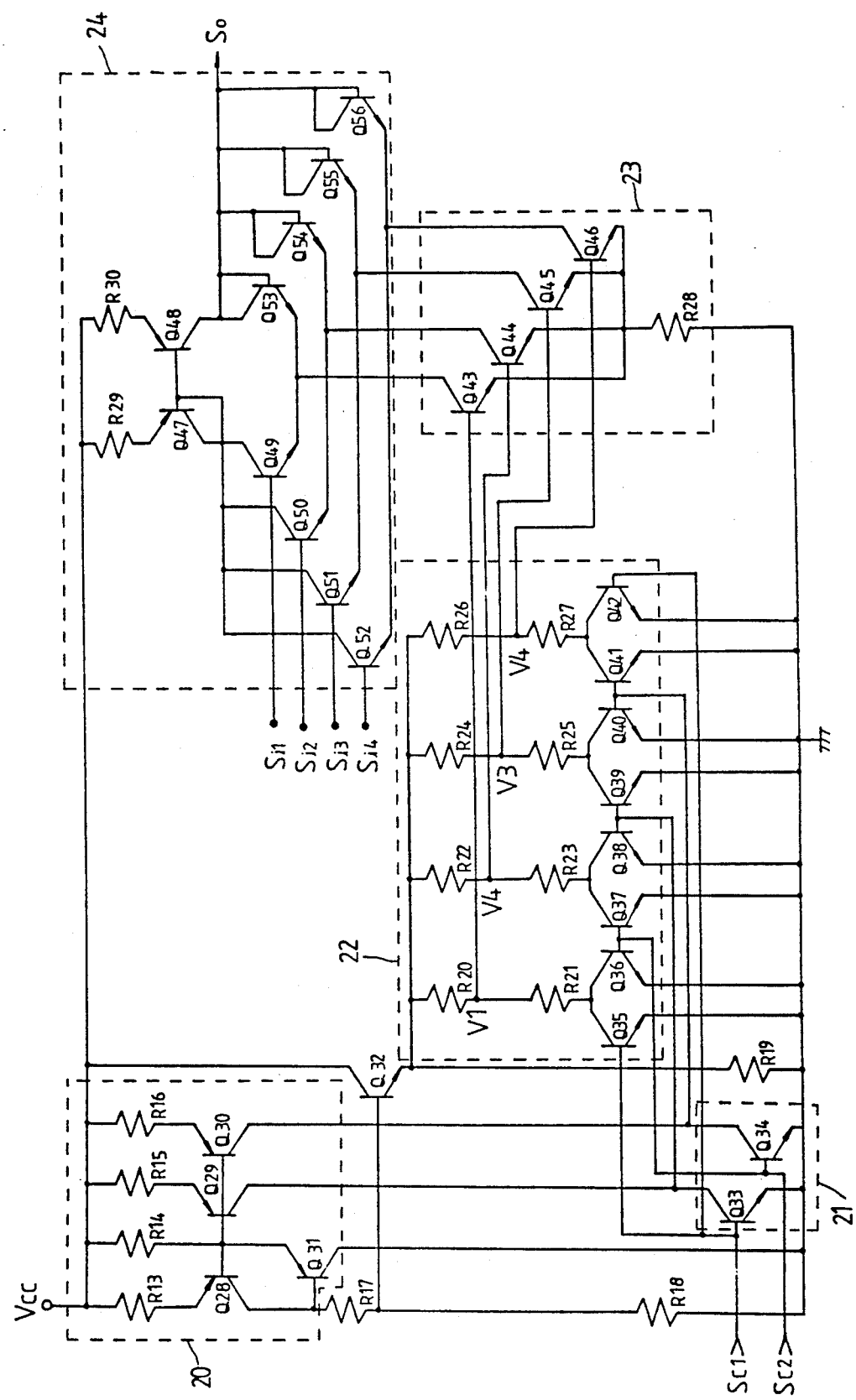
FIG. 2 is a circuit diagram illustrating the preferred embodiment of the multiplexer according to the present invention.

The preferred embodiment of the multiplexer of the present invention will be described in reference to FIG. 2.

A constant current supplying section 20 including four resistors R13-R16 and four transistors Q28-Q31 in the form of a current mirror supply a constant current to the respective parts of the circuit. The current, which flows from a power source Vcc through the 28th transistor Q28 to two resistors R17 and R18, is voltage-divided by these resistors. This voltage-divided current is supplied to the base of the 32nd transistor Q32, to ensure that the emitter of the 32nd transistor Q32 outputs a constant current at all times. The 33rd and 34th transistors Q33 and Q34 are used as inverters 21. These inverters 21 switch the signals from the constant current supplying section 20 in accordance with the state of the first and second control signals Sc1 and Sc2. A NOR gate section 22 is connected to the output side of the inverters 21 and to the first and second control signal terminals. The NOR gate section 22 also receives a constant current from the 32nd transistor Q32. The NOR gate section 22 includes four NOR gates, each of which includes a pair of transistors.

Various combinations of the two control signals Sc1 and Sc2 can be formed, each of which performs a different operation, so that a different output signal can be obtained.

In the first case, assume that the first control signal Sc1 and the second control signal Sc2 have a "low" (L) state. If a signal indicating a low state is supplied to the first and second control signals Sc1 and Sc2, then the 33rd and 34th transistors Q33 and Q34 are turned off. Consequently, the constant current which is supplied to the collectors of the transistors Q33 and Q34 is input to the bases of the 38th and 39th transistors Q38 and Q39 and to the bases of the 40th and 41st transistors Q40 and Q41 of the NOR logic section. Thus, the 38th, 39th, 40th, and 41st transistors Q38-Q41 are turned on when the control signals Sc1 and Sc2 are both low.

The first and second control signals Sc1 and Sc2 are also supplied to the bases of the 35th, 36th, 37th, and 42nd transistors of the NOR logic section 22, respectively. In this example, the first and second control signals have an L state, and therefore, the 35th, 36th, 37th, and 42nd transistors Q35, Q36, Q37 and Q42 are turned off. Meanwhile, the constant current, which is output from the emitter of the 32nd transistor Q32, is supplied to all of the collectors of the transistors in the NOR logic section 22.

In this case, the constant current flows through the voltage-dividing resistors of the NOR logic section 22 to the transistor pairs in the section 22. Because the 35th and 36th transistors Q35 and Q36 are turned off, the divided voltage V1, which is formed by the first pair of voltage-dividing resistors R20 and R21, is supplied to the base of the 43rd transistor Q43, thereby turning on the 43rd transistor Q43. Further, the constant current which flows through voltage-dividing resistors R22 and R23 is supplied to the collectors of the 37th and 38th transistors Q37 and Q38.

Further in this case, since the 37th transistor Q37 is turned off and the 38th transistor Q38 is turned on, the constant current flows through the 38th transistor Q38 to ground. The potential between the second pair of voltage-dividing resistors R22 and R23 is supplied to the base of a 44th transistor Q44. As the 38th transistor is turned on, the potential between resistors R22 and R23 is low, and accordingly, the 44th transistor Q44 is turned off.

Similarly, as the 38th and 40th transistors Q39 and Q40 are turned on, the constant current which flows through the third pair of voltage-dividing resistors R24 and R25 is also supplied to ground after passing through the transistors Q39 and Q40. Thus, the potential between the two resistors R24 and R25, which is supplied to the base of a 45th transistor Q45, is low, and the 45th transistor Q45 is turned off.

Meanwhile, the constant current which flows through the fourth pair of voltage-dividing resistors R26 and R27 is supplied to the collectors of the 41st and 42nd transistors Q41 and Q42. Under this condition, since the 41st transistor Q41 is turned on, and the 42nd transistor Q42 is turned off, the constant current flows through the 41st transistor Q41 to ground. Thus, the potential between the fourth pair of voltage-dividing resistors R26 and R27, that is supplied to the base of a 46th transistor Q46, is low and the 46th transistor Q46 is turned off.

Accordingly, only the 43rd transistor Q43, out of the four transistors Q43–Q46 in the selecting signal supplying section 23, is turned on. Consequently, a 49th transistor Q49, which receives a first input signal into its base from the signal input/output section 24 becomes conductive. This conductive state in transistor Q49 lowers the potential of the voltage which is supplied to the bases of the 47th and 48th transistors Q47 and Q48, so that both of the transistors Q47 and Q48 are turned on. Turning on of the 43rd transistor also causes the 53rd transistor Q53, which is coupled with the collector of the 48th transistor Q48, to be turned on. This causes the first input signal Si1 to be obtained in the form of a final output signal So.

In the second case, it is assumed that the first control signal Sc1 has an L state, and the second control signal Sc2 has an H state. The 33rd transistor Q33 is turned off by the first control signal, and the 34th transistor Q34 is turned on by the second control signal. Thus, the 36th, 37th, 38th and 39th transistors Q36, Q37, Q38 and Q39 are turned on in the NOR logic section 22, while the rest of the transistors Q35, Q40, Q41 and Q42 are turned off. Meanwhile, the constant current which flows from the emitter of the 32nd transistor Q32 to the NOR logic section 22 is supplied through a plurality of parallelly connected voltage-dividing resistors R20-R27 to the respective NOR gates.

The constant current flows through the first pair of voltage-dividing resistors R20 and R21 and through the 36th transistor Q36 (which is turned on) to the ground. Thus, the potential between the first pair of voltage-dividing resistors R20 and R21, that is supplied to the 43rd transistor Q43 is lowered, and the 43rd transistor Q43 is turned off. The constant current which flows through the second pair of voltage-dividing resistors R22 and R23 is supplied through the 37th and 38th transistors Q37 and Q38 (both of which are turned on) to ground. Thus, the 44th transistor Q44, which is connected between the voltage-dividing resistors R22 and R32, is turned off. The constant current which flows through the third pair of voltage-dividing resistors R24 and R25 is supplied through the 39th transistor Q39 to ground. Similarly, the 45th transistor Q45, which is connected between the two resistors R24 and R25, is turned off.

The constant current, which flows through the fourth pair of voltage-dividing resistors R26 and R27, cannot be supplied to ground, because the 41st and 42nd transistors Q41 and Q42 are turned off. Therefore, the voltage which is divided by the two resistors R26 and R27 is supplied to the base of the 46th transistor Q46, and the 46th transistor Q46 is turned on. Thus, among the four transistors of the selecting signal supplying section 23, only the 46th transistor Q46 is turned on. Thus, as in the first case, the 52nd and 56th transistors Q52 and Q56, which are connected to the collector of the 46th transistor Q46 becomes conductive. Therefore, the fourth input signal Si4, which is supplied to the base of the 52nd transistor Q52, is obtained as the final output signal So.

In the third case, it is assumed that the first control signal Sc1 has an H state, and the second control signal Sc2 has an L state. In this case, the 33rd transistor Q33 is turned on by the first control signal, and the 34th transistor Q34 is turned off by the second control signal. The transistors of the NOR logic section 22 are operated in such a manner that the 35th, 40th, 41st and 42nd transistors Q35, Q40, Q41 and Q42 are turned on, and the rest of the transistors Q36, Q37, Q38 and Q39 are turned off. Meanwhile, the constant current which flows from the 32nd transistor Q32 to the NOR logic section 22 is supplied through a plurality of parallelly connected voltage-dividing resistors to the respective NOR gates.

The constant current which flows through the first pair of voltage-dividing resistors R20 and R21 is supplied through the 35th transistor Q35 to the ground. Thus, the 43rd transistor Q43, which is connected between the two resistors R20 and R21, is turned off. The constant current which flows through the second pair of voltage-dividing resistors R22 and R23 is prevented from being supplied to ground, because the 37th and 38th transistors Q37 and Q38 are turned off. Therefore, the voltage V2 which is divided by the two resistors R22 and R23 is supplied to the base of the 44th transistor Q44, which turns the 44th transistor Q44 on.

The constant current, which flows through the third pair of voltage-dividing resistors R24 and R25, is supplied through the 40th transistor Q40 to ground. Then the 45th transistor Q45, which is connected between the two resistors R24 and R25, is turned off. Finally, the constant current which flows through the fourth pair of voltage-dividing resistors R26 and R27 is supplied through the 41st and 42nd transistors Q41 and Q42 (which are turned on) to ground. Then the 46th transistor Q46, which is connected between the two resistors R20 and R27, is turned off. Thus, among the four transistors of the selecting signal supplying section 23, only the 44th transistor Q44 is turned on. Consequently, the 50th and 54th transistors Q50 and Q54, which are connected to the collector of the 44th transistor Q44, become conductive. Therefore, the second input signal Si2 which is supplied to the base of the 50th transistor Q50 is obtained as the final output signal So.

In the fourth case, it is assumed that the first and second control signals Sc1 and Sc2 have an H state. In this case, the 33rd and 34th transistors Q33 and Q34 as inverters are both turned on by the first and second control signals. Then the transistors of the NOR logic section 22 are operated in such a manner that the 35th, 36th, 37th and 42nd transistors Q35, Q36, Q37 and Q42 are turned on, and the rest of the transistors Q38, Q39, Q40 and Q41 are turned off. Further, the constant current, which flows from the 32nd transistor Q32 to the NOR logic section 22, is supplied through a plurality of the parallelly connected voltage-dividing resistors to the respective NOR gates.

The constant current, which flows through the first pair of voltage-dividing resistors R20 and R21, is supplied through the 35th and 36th transistors Q35 and Q36 (both of which are turned on) to ground, and therefore, the 43rd transistor Q43 is turned off. The constant current, which flows through the second pair of voltage-dividing resistors R22 and R23, is supplied through the 37th transistor Q37 to ground and the 44th transistor Q44 is turned off.

However, the constant current, which flows through the third pair of voltage-dividing resistors R24 and R25, is prevented from being supplied to ground, because the 39th and 40th transistors Q39 and Q40 are turned off. Therefore, voltage V3, which is divided by the two resistors R24 nd R25, is supplied to the base of 45th transistor Q45, and the 45th transistor Q45 is turned on.

Finally, the constant current, which flows through the fourth pair of voltage-dividing resistors R26 and R27, is supplied through the 42nd transistor Q42 to ground, and the 46th transistor Q46 is turned off. Thus, among the four transistors of the selecting signal supplying section 23, only the 45th transistor Q45 is turned on. Thus, the 51st and 55th transistors Q51 and Q55, that are connected to the collector of the 45th transistor Q45, become conductive. As a result, the third input signal Si3 which is supplied to the base of the 51st transistor Q51 is obtained as the final output signal So.

Thus, in accordance with the states of the first and second control signals Sc1 and Sc2, one of the input signals Si1, Si2, Si3 and Si4 is selected and obtained as the final output signal So.

Figure 3:
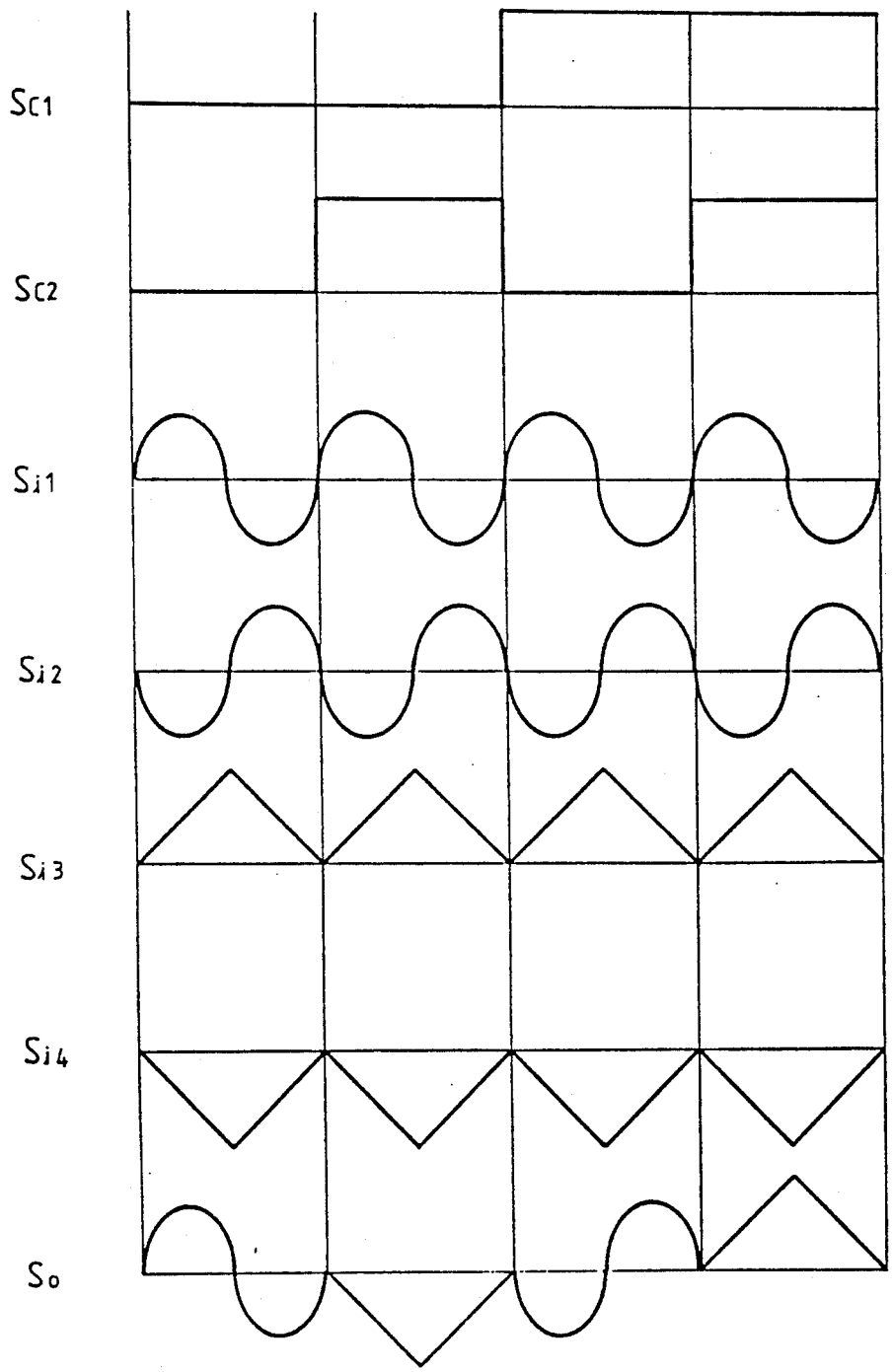
FIG. 3 illustrates the wave patterns of the input/output signals generated in the circuit of FIG. 2.

FIG. 3 illustrates the wave patterns of the input/output signal in accordance with the two control signals in the multiplexer of the present invention. As shown in FIG. 3, the first and second control signals form four combinations, namely LL, LH, HL and HH by combining states of the two signals. In each of these four cases, only one input signal is selected from among the four input signal Si1, Si2, Si3 and Si4, thereby obtaining output signal So as shown in FIG. 3.

According to the multiplexer of the present invention as described above, the number of control signal input terminals is reduced, and all possible combinations of control signals are used as effective control signals. Consequently, errors which normally occur under particular combinations of the conventional system are prevented, thereby assuring stable circuit operation.

What is claimed is:

1. A multiplexer, which receives control signals and a plurality of input signals, and selectively outputs a different input signal for each possible combination of control signals, said multiplexer comprising:
    a NOR logic section, having a plurality of NOR gates therein, for generating a binary logic signal in accordance with said control signals;
    a selection signal supplying section for generating a selection signal in accordance with the binary logic signal generated by said NOR logic section; and
    an inverter section for supplying said control signals to said plurality of NOR gates, such that one NOR gate generates a logic signal having a first state and the remaining NOR gates generate logic signals having a second state.

2. The multiplexer as claimed in claim 1, wherein said inverter section comprises a pair of inverters, each of which inverts a corresponding control signal that is supplied to said NOR logic section.

3. The multiplexer as claimed in claim 1, wherein said plurality of NOR gates includes one NOR gate for each input signal.

4. The multiplexer as claimed in claim 1, wherein said selection signal supplying section comprises a plurality of transistors equal in number to the number of NOR gates in said NOR logic section.

5. The multiplexer as claimed in claim 3, wherein said selection signal supplying section comprises a plurality of transistors equal in number to the number of NOR gates in said NOR logic section.

6. The multiplexer as claimed in claim 4, wherein each of said transistors includes a base that is connected to the output terminal of the corresponding NOR gate of said NOR logic section, in order to control a signal input/output section in accordance with the logic signals output from said NOR logic section.

7. The multiplexer as claimed in claim 1, wherein each NOR gate includes a transistor pair having first and second transistors therein, each of said first transistors having a base connected to a base of a second transistor in a different transistor pair.

8. The multiplexer as claimed in claim 7, wherein said control signals are connected to respective said bases of the transistors in said NOR gates, in order that said control signals turn said transistors ON and OFF.

9. The multiplexer as claimed in claim 7, wherein a base of each transistor in said selection signal supplying section is connected to corresponding collectors of respective said transistor pair.

10. The multiplexer as claimed in claim 1, wherein each NOR gate includes a transistor pair connected to a corresponding selection transistor in said selection signal supplying section, such that a selection transistor generated a selection signal when both transistors in a corresponding transistor pair are turned ON.

11. A multiplexer having a signal input/output section for receiving a plurality of input signals and for selectively outputting only one input signal in accordance with control signals, comprising:
    NOR logic means, having a plurality of NOR gates therein, for generates binary logic signals in accordance with said control signals;
    selection means for supplying selected signals to said signal input/output section in accordance with the logic signals generated by said NOR logic means; and
    means for supplying said control signals to said NOR logic means, wherein said NOR logic means generates one logic signal having a state that differs from a state of the remaining logic signals output from said NOR logic means.

12. The multiplexer as claimed in claim 11, wherein said means for supplying control signals comprises a pair of inverters for inverting the control signals supplied to said NOR logic means.

13. The multiplexer as claimed in claim 11, wherein said NOR logic means includes one NOR gate for each input signal.

14. The multiplexer as claimed in claim 11, wherein said means for supplying the selecting signals comprises one transistor for each NOR gate.

15. The multiplexer as claimed in claim 13, wherein said means for supplying the selecting signals comprises one transistor for each NOR gate.

16. The multiplexer as claimed in claim 14, wherein each of said transistors includes a base connected to an output terminal of the corresponding NOR gate in said NOR logic means.

17. The multiplexer as claimed in claim 11, wherein each NOR gate includes a transistor pair having first and second transistors therein, each of said first transistors having a base connected to a base of a second transistor in a different transistor pair.

18. The multiplexer as claimed in claim 17, wherein said control signals are connected to the bases of the transistors in said NOR gates, in order that said control signals turn said transistors ON and OFF.

19. The multiplexer as claimed in claim 16, wherein a base of each transistor in said selection signal supplying section is connected to corresponding collectors of each transistor pair.

20. The multiplexer as claimed in claim 11, wherein each NOR gate includes a transistor pair connected to a corresponding selection transistor in said selection signal supplying section, such that a selection transistor generated a selection signal when both transistors in a corresponding transistor pair are turned ON.

* * * * *